(12) United States Patent
Takagi

(10) Patent No.: US 6,472,946 B2
(45) Date of Patent: Oct. 29, 2002

(54) MODULATION CIRCUIT AND IMAGE DISPLAY USING THE SAME

(75) Inventor: Yuichi Takagi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/873,425

(22) Filed: Jun. 5, 2001

(65) Prior Publication Data

US 2002/0017962 A1 Feb. 14, 2002

(30) Foreign Application Priority Data

Jun. 6, 2000 (JP) ........................................ 2000-168649

(51) Int. Cl.[7] ................................................ H03K 7/08
(52) U.S. Cl. ........................ 332/109; 345/82; 345/690; 345/589
(58) Field of Search ............................ 332/109; 345/82, 345/83, 89, 690, 691, 589

(56) References Cited

U.S. PATENT DOCUMENTS 6,317,138 B1 * 11/2001 Yano et al. ................. 345/589

\* cited by examiner

Primary Examiner—Terry D. Cunningham
Assistant Examiner—Quan Tra
(74) Attorney, Agent, or Firm—Rader, Fishman & Grauer PLLC; Ronald P. Kananen, Esq.

(57) ABSTRACT

A modulation circuit and an image display able to be set to match the relation of luminance data and a luminance of a LED with a γ-characteristic of a CRT without increasing the bit length of the luminance data or performing pre-processing, such as making corrections to the luminance data. By the A/D converter, the digitalized luminance data is converted into serial data by the controller and is output to pulse width modulation circuits in cascade connection. In each pulse width modulation circuit, a pulse current of a pulse width corresponding to the luminance data is generated, and the LED connected to each pulse width modulation circuit is driven by the current to emit light. Further, the amplitude of the pulse current is variable in accordance with the count of a counter for counting clock signals in the period of the pulse current. As a result, the relation of the time-averaged pulse current flowing in the LED and the luminance data can be made to match the γ-characteristic of a CRT.

18 Claims, 11 Drawing Sheets

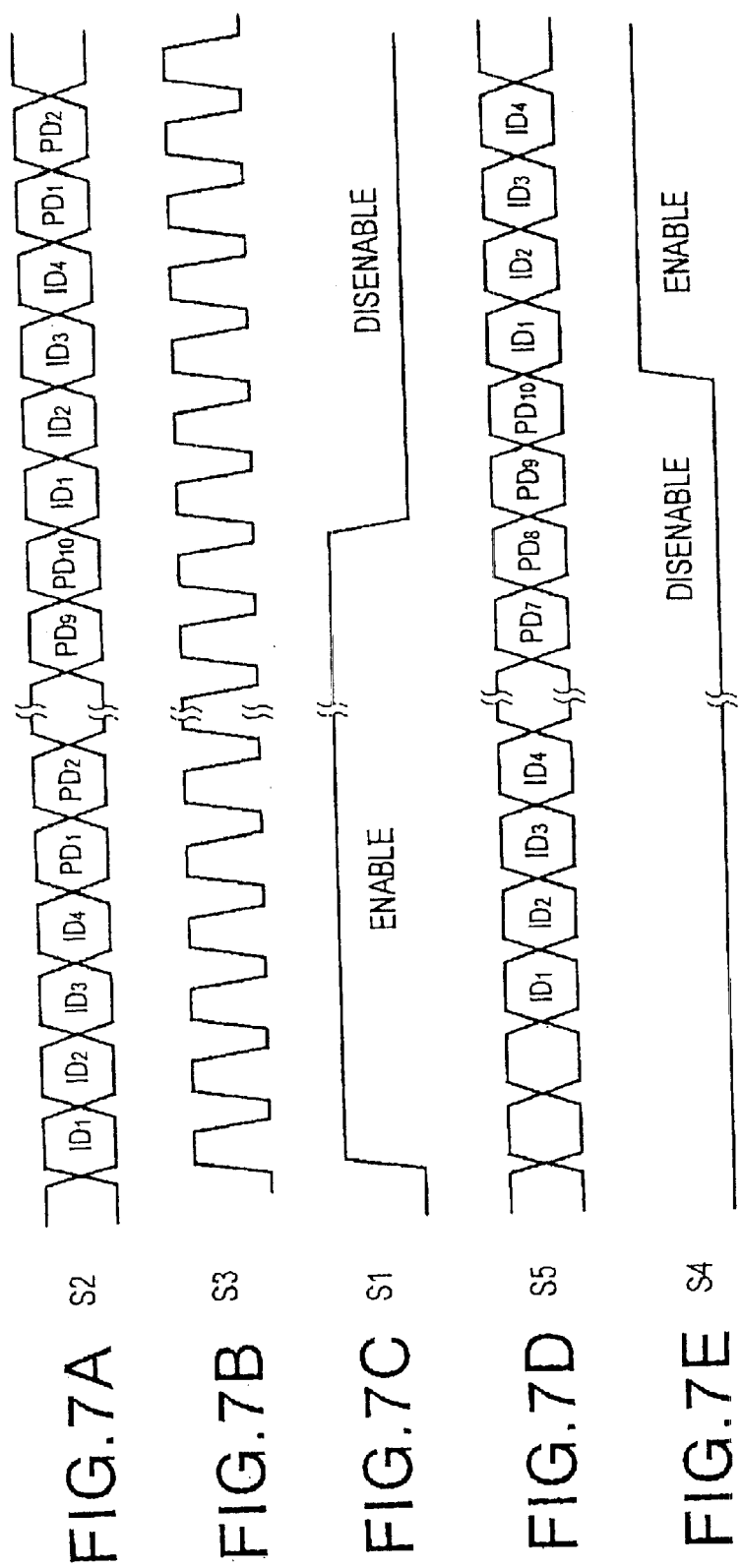

MODULATION CIRCUIT AND IMAGE DISPLAY USING THE SAME

BACKGROUND OF THE INVENTION

1. Field of the Invention

The present invention relates to a modulation circuit for outputting pulse signals modulated in accordance with the values of input data at a predetermined period and an image display and a modulation method using the modulation circuit and, more particularly, relates to a modulation circuit of a drive signal for a light-emitting diode (LED) and an image display comprising LEDs.

2. Description of the Related Art

Since the invention of the blue LED, LED color displays that use LEDs to form pictures by pixels emitting the three primary colors have been widely and generally fabricated. LEDs are highly durable and can be used semi-permanently, so they are optimal for long-term use outdoors. Therefore, LEDs have been extensively used for large-scale displays in stadiums and event sites and for information display panels and advertisements on sides of buildings and inside railway stations. In recent years, along with the increasing luminance and lower prices of blue LEDs, such LED color displays have been spreading rapidly.

FIG. 1 is a view of a drive circuit of an LED forming a pixel of an LED display.

In FIG. 1, reference numeral 100 indicates a drive circuit and 200 an LED. In addition, Spx represents a video signal supplied to each individual pixel; and, Id represents a current flowing through the LED 200.

The drive circuit 100 outputs a current corresponding to the video signal Spx to the LED 200, while the LED 200 emits light according to the supplied current. An LED display is comprised of exactly the same number of circuits consisting of the drive circuits 100 and LEDs shown in FIG. 1 as that of the pixels. By making the LEDs of the pixels emit light with luminances according to the video signals Spx supplied to the pixels, a person viewing the screen can recognize a picture. The video signal Spx supplied to each pixel is generally input to the drive circuit 100 as a digital value of a certain number of bits.

FIG. 2 is a view of the waveform of the current flowing through the LED 200 in FIG. 1.

In FIG. 2, the ordinate and abscissa indicate the current flowing through the LED 200 and time by relative values, respectively. In addition, Ipulse indicates the peak value of the pulse-shape d current flowing through the LED, tw indicates the time width of the current pulse, and T indicates the period of the current pulse.

As shown in FIG. 2, the current flowing through the LED forming a pixel of an LED display has a periodic pulse-like waveform. The luminance is controlled by pulse width modulation to make the pulse width tw variable.

In principle, it is possible to use a direct current as that flowing through the LED and make the current value variable in accordance with the video signal Spx to adjust the luminance, but in this case, it is necessary to finely control the current value by the drive circuit, and there is a disadvantage that the circuit for this control ends up increasing the number of parts. Because it is easier to increase the resolution of the time than the resolution of the current value, in general, the pulse width modulation system generating a current of a waveform as shown in FIG. 2 is adopted.

Due to the nature of human senses, light blinking in a manner staying lit for less than 1/60 of a second is perceived to have a constant luminance. Therefore, even a LED is driven by a current of the waveform shown in FIG. 2, if the period T of the current is shorter than the aforesaid time, the blinking light from the LED will be perceived by people as light of a constant luminance. Further, the luminance of an LED perceived by the human senses is proportional to the current flowing through the LED averaged over time. Therefore, the luminance changes in proportion with the duty of the pulse current.

The level of a video signal input to an LED display, however, is normalized in advance to match the luminance characteristics of a cathode ray tube (CRT). If such a video signal is input as it is to an LED, which has different luminance characteristics from a CRT pixel, the following problem arises.

FIG. 3 is a view of the relation of the luminances of a LED and CRT pixel with the level of an input signal.

In FIG. 3, the ordinate represents the luminance of a LED or CRT pixel, while the abscissa represents the level of the signal input to a LED or a CRT pixel all by relative values. The curves indicated by A and B show the luminance characteristics of a CRT pixel and a LED, respectively.

Note that for the luminance characteristic A of a CRT pixel, the signal level is expressed by the voltage value of the video signal, while for the luminance characteristic B of an LED pixel, the signal level is expressed by the value of the current flowing through the LED.

As shown in FIG. 3, the luminance of an LED has a linear relation with the signal level, while the luminance of a CRT pixel has a nonlinear relation with the signal level. In general, the luminance of a CRT pixel is proportional to the 2.2th power of the voltage level of the video signal ($\gamma$ characteristic). If a current proportional to a video signal normalized to match such a $\gamma$ characteristic is directly supplied to an LED, the LED appears brighter than a CRT pixel in the region of low output of light, but it appears darker than a CRT pixel in the region of high output of light. Consequently, a picture formed by such pixels has a ratio of luminance of the bright portions and dark portions different from the original picture, so it looks unnatural to viewers.

In order to solve this problem, in an LED display of the related art, a signal corrected to eliminate the influence due to the above luminance characteristic of the video signal is input to the drive circuit 100 as the above video signal Spx. Specifically, for example, when driving an LED of a linear luminance characteristic by a video signal produced to match a CRT pixel emitting light of a luminance proportional to the 2.2th power of the signal level, a signal proportional to the 2.2th power of the video signal is generated to drive the LED.

However, if the bit length of the input video signal is not sufficiently large, the binary data obtained by raising this digitalized image data to the 2.2th power is incapable of expressing fine changes of value in the region where the value of the input video signal is small. In other words, if the bit length of the digitalized video signal is small, the grey scale ends up rough in the low luminance region, resulting in an unnatural picture. In order to avoid such a problem, it is necessary to increase the bit length of the video signal. Specifically, in a LED display of the related art, it is necessary to generate a video signal of a length of 12 to 16 bits to reproduce a picture which can be expressed by a video signal of a length of 8 bits in the case of a CRT. If the bit length of the video signal is increased in this way, the bit length of the pulse width modulation circuits for driving the LEDs also has to be increased, so the overall circuit scale becomes large and the cost and power consumption rise.

Further, a pulse of the waveform shown in FIG. 2 is generally generated by counting clock signals serving as a time reference. Increasing the bit length of the video signal means increasing the number of times to count the clock signals by that extent, so when using clock signals of the same frequency, the period T of pulse width modulation ends up longer. For example, when generating a 12-bit video signal, which is 4 bits larger than an 8-bit video signal, performing pulse width modulation for it and comparing it with the same frequency of the clock signal, the period T of pulse width modulation becomes 16 times that of an 8-bit video signal. Since the period T of pulse width modulation is set according to the characteristic of the human senses described above, if this period is too long, flickering where the blinking of the light will be perceived by the human eyes will be caused and the picture will become hard to view. Furthermore, this flickering by nature is more noticeable to the human eyes in a LED display compared with a CRT display, so the period T of pulse width modulation has to be several times shorter than that of the usual refresh rate, for example, 1/50 of a second.

To increase the bit length of video signals and shorten the period T of pulse width modulation, it is enough to increase the frequency of the clock signals used in the pulse width modulation circuit, but this has the disadvantage of increasing the power consumption of the circuit. Further, in practice, as it is difficult to further increase the current frequency of 10 to 20 MHZ 10 or more fold, there is a limit to increasing the frequency of the clock signal.

SUMMARY OF THE INVENTION

An object of the present invention is to provide a modulation circuit for modulating input data on a pulse width in response to the value of the input data and generating a pulse signal at a predetermined period that is able to be set to match the relation of the input data and the pulse width with a certain characteristic without increasing the bit length of the input data or adding any process, such as making corrections to the input data, and to provide an image display provided with the modulation circuit.

In order to achieve the object, according to a first aspect of the present invention, there is provided a modulation circuit for modulating input data on a pulse width and a pulse amplitude in response to the value of the input data and generating a pulse signal at a predetermined period, comprising a phase data generating circuit for generating phase data whose value is varied in response to a phase in the period, a data comparison circuit for setting a control signal at a first level at the beginning of every period, comparing the phase data and the input data, and setting the control signal at a second level when the phase data and the input data coincide, and a pulse signal generating circuit for setting the level of the pulse signal at a reference level at the beginning of every period, changing the level of the pulse signal in response to the phase data when the control signal is at the first level, setting the level of the pulse signal at the reference level when the level of the control signal is changed to the second level, and outputting the resultant pulse signal.

According to the modulation circuit related to the first aspect of the present invention, in the phase data generating circuit, the phase data corresponding to the phase in the period are generated. In the data comparison circuit, the control signal is at the first level at the beginning of every period, the phase data and the input data are compared, and the control signal is set at the second level when the phase data and the input data coincide. The level of the pulse signal output from the pulse signal generating circuit is set at a reference level at the beginning of every period, changed in response to the value of the phase data when the control signal is at the first level, and set at the reference level when the control signal is changed to the second level.

Preferably, when the control signal is at the first level, the pulse signal outputting circuit changes the level of the pulse signal in proportion to the product of input pulse amplitude data and the phase data.

Further, the pulse signal outputting circuit may comprise a first conversion circuit for converting input pulse amplitude data into an analog signal having a level corresponding to the value of the input data and a second conversion circuit for converting the phase data into the pulse signal having a level corresponding to the value of the phase data with the analog signal as a reference. Alternatively, the pulse signal outputting circuit may comprise a multiplier for multiplying the value of the input pulse amplitude data with that of the phase data and a conversion circuit for converting the multiplication result from the multiplier into the pulse signal having a level corresponding to the value of the result. In addition, the phase data generating circuit may count input clock pulses, initialize the count to a preset initial value and count the clock pulses again when the count reaches a preset value, and output the count as the phase data.

According to a second aspect of the present invention, there is provided a modulation circuit for modulating input data on a pulse width and pulse amplitude in response to the value of the input data and generating a pulse signal at a predetermined period, comprising a data outputting circuit which compares the input data with a plurality of preset initial phase data at phases of the period corresponding to the initial phase data, and as a result of the comparison, outputs pulse width data corresponding to a difference between a value of one of the initial phase data and that of the input data and a specified pulse amplitude data corresponding to the initial phase data when the phase corresponding to one of the initial phase data is earlier than the phase corresponding to the input data, a phase data generating circuit for generating a phase data whose value is varied in response to a phase in the period, a data comparison circuit for setting a control signal at a first level at the beginning of every period, comparing the phase data and the pulse width data, and setting the control signal at a second level when the phase data and the pulse width data coincide, and a pulse signal generating circuit for setting the pulse signal at a reference level at the beginning of every period, changing the level of the pulse signal in response to the pulse amplitude data when the control signal is at the first level, setting the pulse signal at the reference level when the control signal is changed to the second level, and outputting the resultant pulse signal.

According to the modulation circuit related to the second aspect of the present invention, at phases of the period corresponding to the plurality of preset initial phase data, the input data is compared with the values of the initial phase data by the data outputting circuit. As a result of the comparison, pulse width data corresponding to a difference between a value of one of the initial phase data and that of the input data and specified pulse amplitude data corresponding to the initial phase data are output when the phase corresponding to one of the initial phase data is earlier than the phase corresponding to the input data. In the phase data generating circuit, the phase data corresponding to a phase in the period are generated. In the data comparison circuit, the control signal is at the first level at the beginning of every period, the phase data and the pulse width data are compared, and the control signal is set at the second level when the phase data and the pulse width data coincide. The level of the pulse signal output from the pulse signal generating circuit is set at a reference level at the beginning of every period, changed in response to the value of the pulse amplitude data when the control signal is at the first level, and set at the reference level when the control signal is changed to the second level.

Further, the data outputting circuit may count input clock pulses, initialize the count to a preset initial value and count the clock pulses again when the count reaches a preset value, and compare one of the initial phase data with the value of the input data at a phase where the count coincides with the initial phase data.

Further, the phase data generating circuit may also count input clock pulses, initialize the count to a preset initial value and count the clock pulses again when the count reaches a preset value, and output the count as the phase data.

According to a third aspect of the present invention, there is provided an image display comprising a plurality of modulation circuits each modulating input data on a pulse width and a pulse amplitude in response to the value of the input data and generating a pulse signal at a predetermined period and a plurality of light emitting elements arranged bi-dimensionally to form an image displaying member and each emitting light of a luminance corresponding to levels of the pulse signals, wherein each modulation circuit comprises a phase data generating circuit for generating phase data whose value is varied in response to a phase in the period, a data comparison circuit for setting a control signal at a first level at the beginning of every period, comparing the phase data and the input data, and setting the control signal at a second level when the phase data and the input data coincide, and a pulse signal generating circuit for setting the level of the pulse signal at a reference level at the beginning of every period, changing the level of the pulse signal in response to the phase data when the control signal is at the first level, setting the level of the pulse signal at the reference level when the level of the control signal is changed to the second level, and outputting the resultant pulse signal.

According to the image display related to the third aspect of the present invention, in the plurality of modulation circuits, pulse widths and pulse amplitudes of the input data are modulated in response to the value of the input data and pulse signals are generated at a predetermined period. The plurality of light emitting elements emit light of luminances corresponding to levels of the pulse signals, and an image is displayed by the image displaying member.

In addition, in the phase data generating circuit of each modulation circuit, the phase data corresponding to the phase in the period are generated. In the data comparison circuit, the control signal is at the first level at the beginning of every period, the phase data and the input data are compared, and the control signal is set at the second level when the phase data and the input data coincide. The level of the pulse signal output from the pulse signal generating circuit is set at a reference level at the beginning of every period, changed in response to the value of the phase data when the control signal is at the first level, and set at the reference level when the control signal is changed to the second level.

Preferably, each modulation circuit comprises a first input terminal into which the input data are input, a first output terminal from which the input data is are output, a second input terminal into which an enable signal is input, a second output terminal from which the enable signal is output, an enable signal generating circuit for outputting the enable signal from the second output terminal when the enable signal input from the second input terminal changes from the enable state to the disenable state, said enable signal being set to an enable state for a predetermined period and then to a disenable state, and a data holding circuit for holding the input data input from the first input terminal when the enable signal is in the enable state and outputting the held input data when the enable signal changes from the enable state to the disenable state, and the first output terminal and the second output terminal of each modulation circuit are connected in cascade with the first input terminal and the second input terminal of a modulation circuit at the next stage, respectively, and the phase data generating circuit sets the value of the phase data to a preset initial data when the enable signal is in the enable state, and periodically changes the value of the phase data at said period when the enable signal is in the disenable state, and the data comparison circuit sets the control signal to the second level when the enable signal is in the enable state, and compares an input data output from the data holding circuit with the phase data when the enable signal is in the disenable state.

Further, preferably, when the control signal is at the first level, the pulse signal outputting circuit changes the level of the pulse signal in proportion to the product of the input pulse amplitude data and the phase data.

According to a fourth aspect of the present invention, there is provided an image display comprising a plurality of modulation circuits, each modulating input data on a pulse width and a pulse amplitude in response to the value of the input data and generating a pulse signal at a predetermined period, and a plurality of light emitting elements arranged bi-dimensionally to form an image displaying member and each emitting light of a luminance corresponding to levels of the pulse signals, wherein each modulation circuit comprises a data outputting circuit which compares the input data with a plurality of preset initial phase data at phases of the period corresponding to the initial phase data, and as a result of the comparison, outputs a pulse width data corresponding to a difference between a value of one of the initial phase data and that of the input data and a specified pulse amplitude data corresponding to the initial phase data when the phase corresponding to one of the initial phase data is earlier than the phase corresponding to the input data, a phase data generating circuit for generating a phase data whose value is varied in response to a phase in the period, a data comparison circuit for setting a control signal at a first level at the beginning of every period, comparing the phase data and the pulse width data, and setting the control signal at a second level when the phase data and the pulse width data coincide, and a pulse signal generating circuit for setting the level of the pulse signal at a reference level at the beginning of every period, changing the level of the pulse signal in response to the pulse amplitude data when the control signal is at the first level, setting the level of the pulse signal at the reference level when the level of the control signal is changed to the second level, and outputting the resultant pulse signal.

According to the image display related to the fourth aspect of the present invention, in the plurality of modulation circuits, pulse widths and pulse amplitudes of the input data are modulated in response to the value of the input data and pulse signals are generated at a predetermined period. The plurality of light emitting elements emit light of luminances corresponding to levels of the pulse signals, and an image is displayed by the image displaying member.

Further, in each modulation circuit, at phases of the period corresponding to the plurality of preset initial phase data, the input data is compared with the values of the initial phase data by the data outputting circuit. As a result of the comparison, pulse width data corresponding to a difference between a value of one of the initial phase data and that of the input data and specified pulse amplitude data corresponding to the initial phase data are output when the phase corresponding to one of the initial phase data is earlier than the phase corresponding to the input data. In the phase data generating circuit, the phase data corresponding to a phase in the period is generated. In the data comparison circuit, the control signal is at the first level at the beginning of every period, the phase data and the pulse width data are compared, and the control signal is set at the second level when the phase data and the pulse width data coincide. The level of the pulse signal output from the pulse signal generating circuit is set at a reference level at the beginning of every period is changed in response to the value of the pulse amplitude data when the control signal is at the first level, and set at the reference level when the control signal is changed to the second level.

Preferably, each said modulation circuit comprises a first input terminal into which the pulse width data and the pulse amplitude data are input, a first output terminal from which the pulse width data and the pulse amplitude data are output, a second input terminal into which an enable signal is input, a second output terminal from which the enable signal is output, an enable signal generating circuit for outputting the enable signal from the second output terminal, when the enable signal input from the second input terminal changes from the enable state to the disenable state, said enable signal being set to an enable state for a predetermined period and then to a disenable state, and a data holding circuit for holding the pulse width data and the pulse amplitude data input from the first input terminal when the enable signal is in the enable state and outputting the held pulse width data and pulse amplitude data when the enable signal changes from the enable state to the disenable state, and the first output terminal and the second output terminal of each modulation circuit are connected in cascade with the first input terminal and the second input terminal of a modulation circuit at the next stage, respectively, and the phase data generating circuit sets the value of the phase data to a preset initial data when the enable signal is in the enable state and periodically changes the value of the phase data at said period when the enable signal is in the disenable state, and the data comparison circuit sets the control signal to the second level when the enable signal is in the enable state and compares a pulse width data output from the data holding circuit with the phase data when the enable signal is in the disenable state.

BRIEF DESCRIPTION OF THE DRAWINGS

These and other objects and features of the present invention will become clearer from the following description of the preferred embodiments given with reference to the accompanying drawings, in which:

FIGS. 7A to 7E are time charts of serial data input to and output from a pulse width modulation circuit and an enable signal;

DESCRIPTION OF THE PREFERRED EMBODIMENTS

Below, descriptions will be given of preferred embodiments of a modulation circuit and an image display of the present invention applied to an LED display with reference to the accompanying drawings.

First Embodiment

Figure 1:
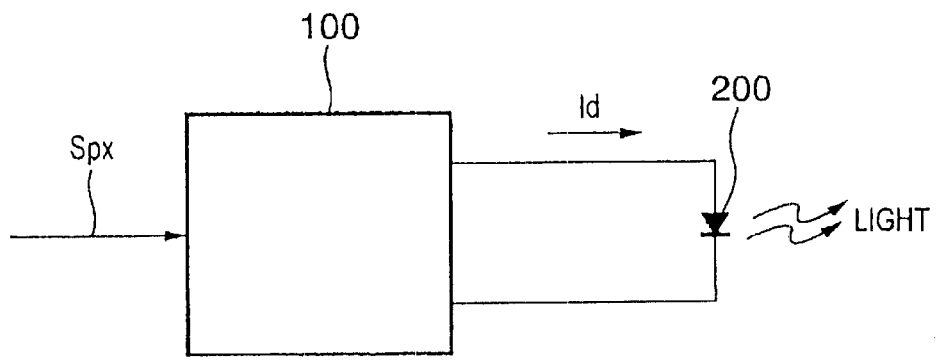
FIG. 1 is a schematic view of a drive circuit for a LED forming a pixel of a LED display.
Figure 2:
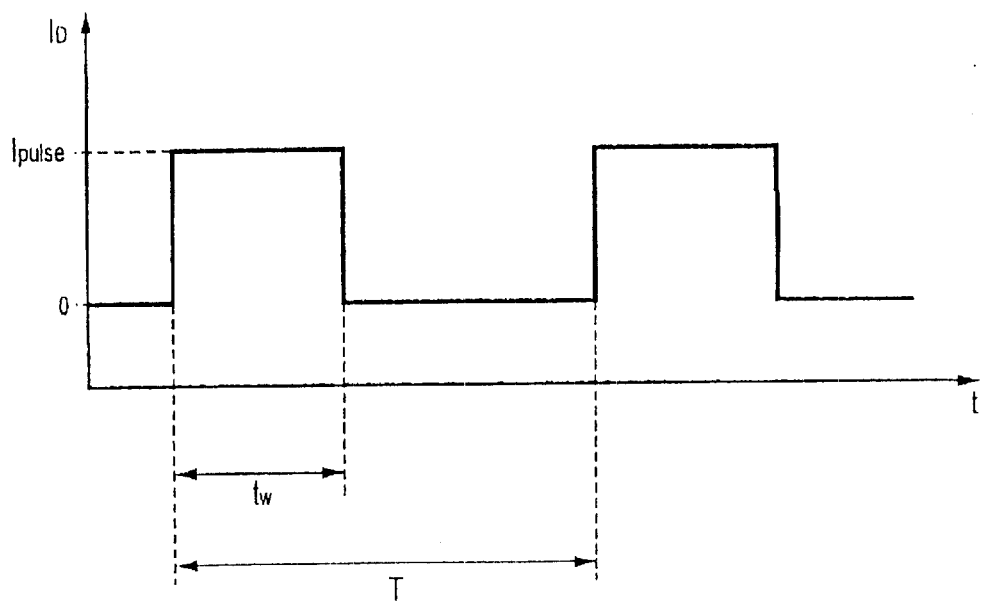
FIG. 2 is a view of a waveform of a current flowing through the LED in FIG. 1.
Figure 3:
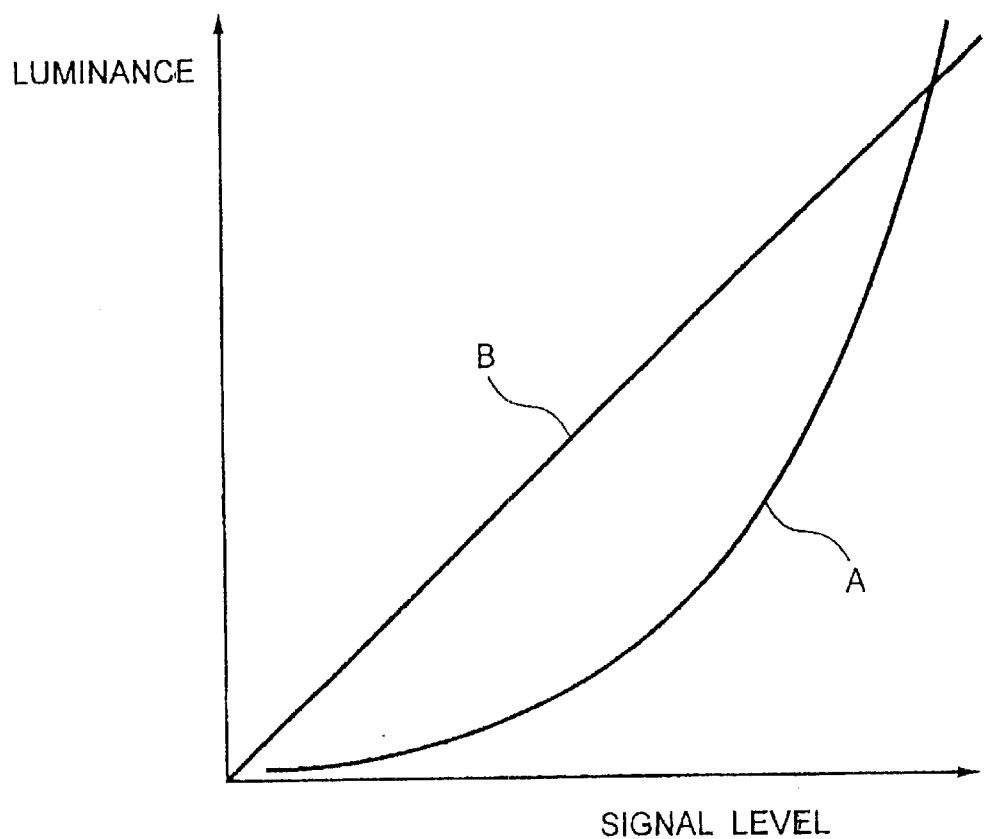
FIG. 3 is a view of the relations of the luminance of a LED and CRT with the level of an input signal.
Figure 4:
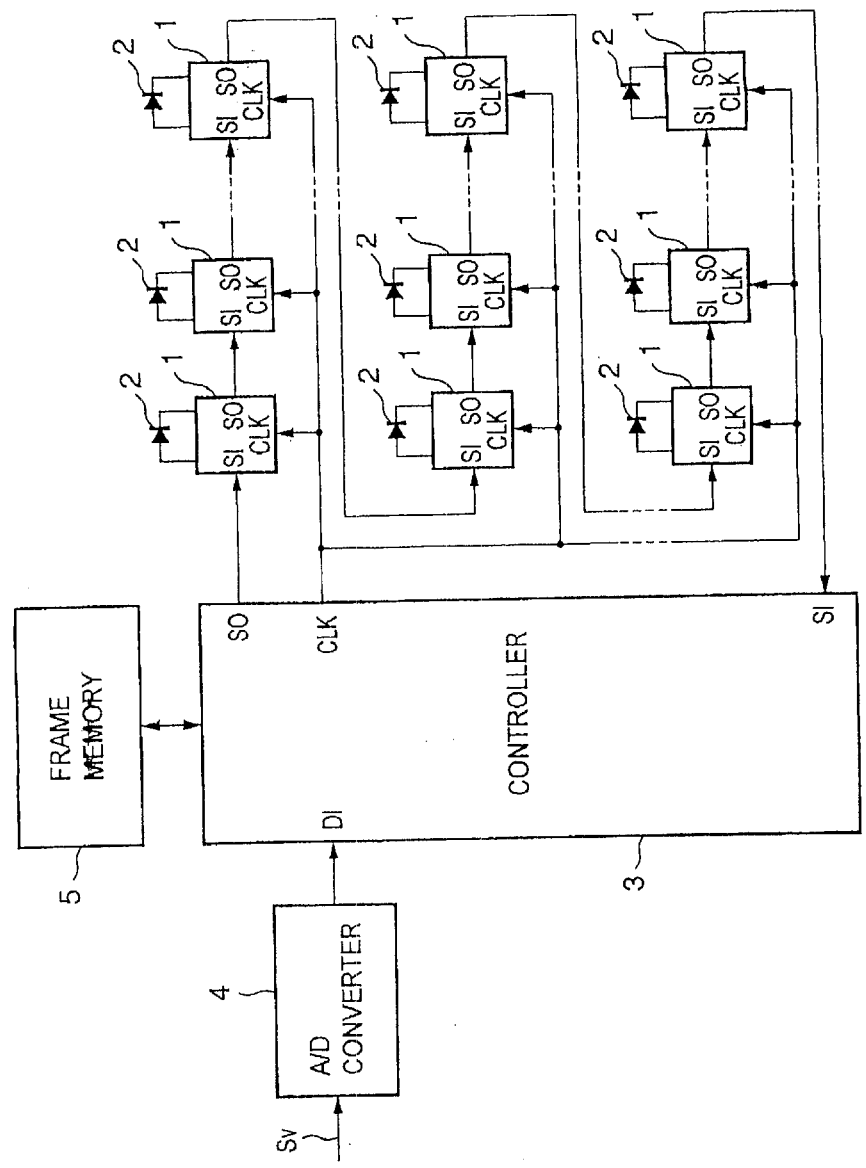
FIG. 4 is a block diagram of a LED display according to the present invention.

FIG. 4 is a block diagram of an LED display according to the present invention.

In FIG. 4, numerals 1, 2, 3, 4, and 5 represent a pulse width modulation circuit, a LED, a controller, an A/D converter, and a frame memory, respectively.

The pulse width modulation circuit 1 supplies a pulse current to a LED 2 on the basis of pulse width data and pulse amplitude data transmitted from an output terminal SO of the controller 3. There is one pulse width modulation circuit for the LED of each pixel, so the number of the pulse width modulation circuits is the same as that of the LEDs forming one screen.

The pulse width data and pulse amplitude data received by the pulse width modulation circuit 1 from the controller 3 is serial data and is received at a serial data input terminal SI. In addition, the pulse width modulation circuit 1 is provided with a serial data output terminal SO for giving a certain delay to and outputting the data received from the input terminal SI. The output terminal SO is connected in cascade with the input SI of other pulse width modulation circuits. In this way, the serial data input terminal SI and the serial data output terminal SO of the pulse width modulation circuit 1 are connected, and serial data are successively transmitted from the input SI to the output terminal SO, so data are transferred from the controller 3 to the pulse width modulation circuit 1. In FIG. 4, the last output terminal SO of the cascade connected pulse width modulation circuits 1 is connected to the controller 3. The controller 3 uses this returned signal to check the operational state of each pulse width modulation circuit 1.

Note that each pulse width modulation circuit 1 is provided with a clock input terminal CLK. The controller 3 supplies a common clock signal to each pulse width modulation circuit 1.

The controller 3 receives a digitalized video signal at the terminal D1 input from the A/D converter 4. From these data, the controller 3 extracts the luminance data of each LED pixel and stores them in the frame memory 5. The controller 3 further reads out the data of each LED pixel from the frame memory 5, converts them to serial data, and outputs the data to the pulse width modulation circuits 1 from the output terminal SO. The serial data output from the terminal SO are synchronized with the clock signals generated by the controller 3. The clock signals are output to all pulse width modulation circuits 1 through the clock output terminal CLK.

The input terminal SI of the controller 3 receives serial data returned from the pulse width modulation circuits 1. This serial data contains information on the operational states of the pulse width modulation circuits 1 (breakdowns of LEDs, overheating of ICs, etc.). According to this information, the controller 3 notifies the breakdown on a not illustrated display.

The A/D converter 4 converts an analog video signal Sv into a digital data of a preset bit length and outputs the data to the controller 3.

The frame memory 5 temporarily stores the luminance data of LED pixels extracted at the controller 3. The luminance data of LED pixels are managed and stored one field by one (or one frame). The controller 3 reads out the luminance data one frame by one and outputs them to the pulse width modulation circuits 1.

The analog video signal Sv is converted into a digital data of a preset bit length by the A/D converter 4 and is output to the controller 3. The controller 3 extracts the luminance data of each pixel and outputs the data to the frame memory 5. The frame memory 5 temporarily stores the luminance data of LED pixels one frame by one. The luminance data stored in the frame memory 5 for pixels forming one frame are read out to the controller 3 at a time specified by the controller 3. After being converted into serial data, the data are output to the pulse width modulation circuits 1. According to the input luminance data of each pixel, the pulse width modulation circuits 1 supply pulse currents of a certain width to the LEDs of pixels to light the LEDs and display a picture. A moving picture is displayed by repeating the operation of outputting luminance data of each frame to the pulse width modulation circuits 1 and lighting the LEDs in the above way.

Note that the luminance data of the pixels are output to the pulse width modulation circuits 1 as serial data in the above descriptions, but they may also be output as parallel data. In this case, the number of wires increases with the bit length of the data, but the luminance data can be set into the pulse width modulation circuits 1 faster than serial data.

In addition, it is not necessary to store all of the data forming one frame into the frame memory 5. For example, data corresponding to a horizontal period may be first stored in the memory as a buffer and then output. In addition, if the conversion time of the A/D converter 4 and the processing time of the controller 3 are sufficiently short, it is possible to convert data to serial data directly for output without using a buffer.

Below, the operation of the controller 3 will be described.

Figure 5:
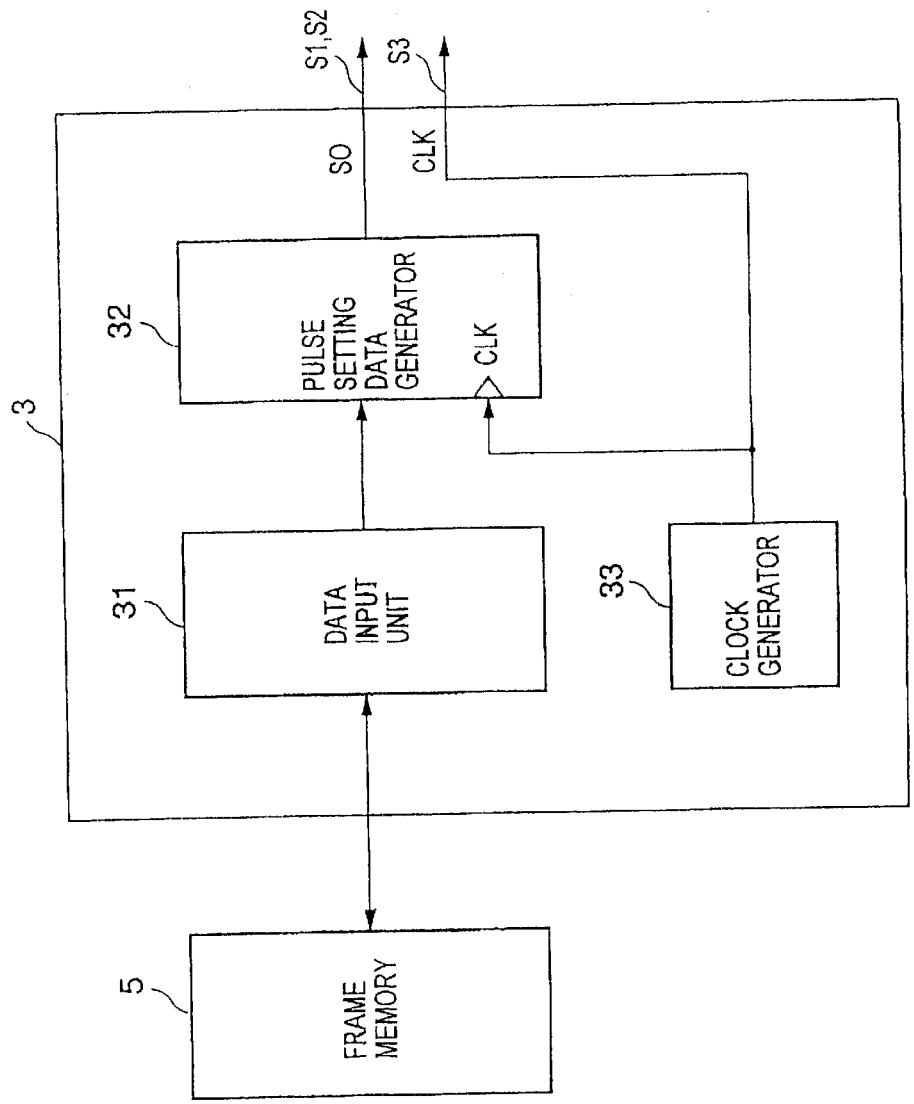
FIG. 5 is a block diagram for explaining the operation of a controller in a first embodiment.

FIG. 5 is a block diagram for explaining the operation of the controller 3 in the first embodiment.

In FIG. 5, reference numerals 31, 32 and 33 represent a data input unit, a pulse setting data generator and a clock generator, respectively. The same reference numerals are used for the same elements in FIG. 5 and FIG. 4.

The data input unit 31 reads the luminance data of pixels from the frame memory 5 in a specified order, holds and then outputs them to the pulse setting data generator 32.

The pulse setting data generator 32 converts specified pulse amplitude data and luminance data (pulse width data) input from the data input unit 31 to serial data synchronized with the clock signals generated by the clock generator 33 and outputs them to the terminal SO.

An enable signal synchronized with the serial data for setting the serial data into pulse width modulation circuits 1 is also generated and output to the terminal SDO.

The timing of the serial data and enable signal generated in the pulse setting data generator 32 will be described in detail later.

The clock generator 33 supplies clock signals to the pulse setting data generator 32. Further, it outputs the clock signals from the terminal CLK and supplies them to the pulse width modulation circuits 1.

The luminance data of pixels stored in the frame memory 5 are read into the controller 3 in a preset order by the data input unit 31. The luminance data are converted into serial data by the pulse setting data generator 32. In each serial data, predetermined pulse amplitude data for setting the amplitude of a pulse current flowing through a LED 2 are included. The serial data generated are synchronized with the clock signals output by the clock generator 33 and are output from the terminal SO to the pulse width modulation circuits 1.

An enable signal synchronized with the serial data is also generated and output from the terminal SO to the pulse modulation circuits 1 together with the serial data.

Below, the operation of a pulse width modulation circuit 1 will be described.

Figure 6:
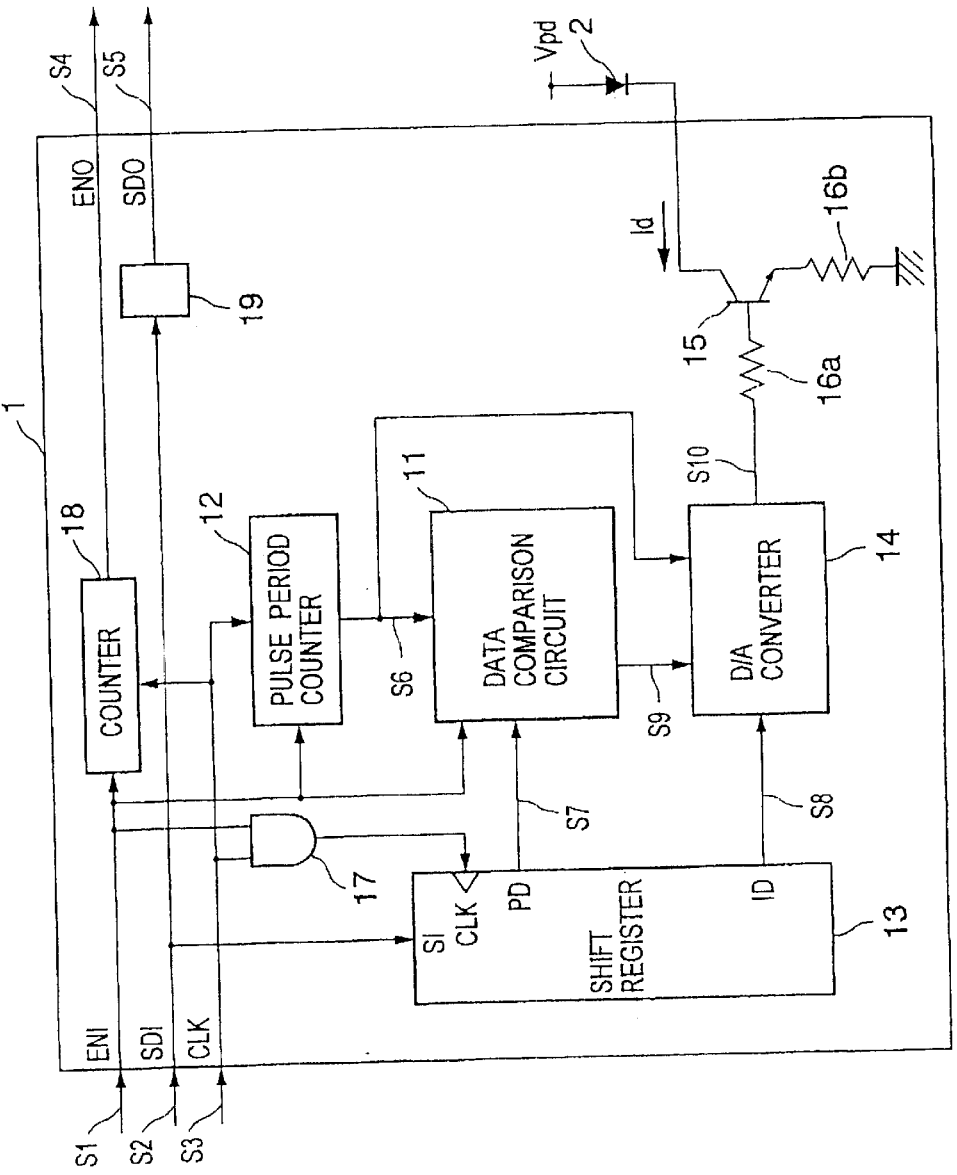
FIG. 6 is a block diagram of a pulse width modulation circuit in the first embodiment.

FIG. 6 is a block diagram for explaining the operation of a pulse width modulation circuit 1 in the first embodiment.

In FIG. 6, a data comparison circuit is represented by 11, a pulse period counter is represented by 12, a shift register is represented by 13, a D/A converter is represented by 14, an npn transistor is represented by 15, resistors is represented by 16a and 16b, an AND circuit is represented by 17, a counter is represented by 18, and a delay circuit is represented by 19.

In FIG. 4, the signals output to the pulse width modulation circuits 1 from the terminal SO of the controller 3 are equivalent to the enable signal S1 and the serial data S2 in FIG. 6.

The data comparison circuit 11 compares the pulse count S6 of the clock signals S3 output from the pulse period counter 12 and the pulse width data S7 output from the shift register 13. According to the result of comparison, the data comparison circuit 11 sets a signal S9 in an ON state or an OFF state and outputs the signal to the D/A converter 14. The output signal S10 of the D/A converter 14 is set in an ON state or an OFF state according to the signal S9, and in turn the npn transistor 15 is set ON or OFF according to the signal S10. That is, according to the value of the pulse width data S7, the time when the signal S9 is set in an ON state or an OFF state is changed, and so the time when the npn transistor 15 is set ON or OFF is changed, therefore the duty ratio of a pulse current flowing through an LED 2 is controlled.

The data comparison circuit 11 sets the output signal S9 in an OFF state when the enable signal S1 is in an enable state. When the output signal S9 is in an OFF state, the output signal S10 is set in an OFF state in the D/A converter 14, and, therefore, the npn transistor 15 is set OFF. Namely, when the enable signal S1 is in an enable state, the output signal S9 is set in an OFF state, so the LED 2 stops emitting light.

The pulse period counter 12 counts the clock signal S3 from a certain initial value when the enable signal S1 is in a disenable state. When reaching a preset value, the count S6 is reset to the certain initial value, and counting is started again from the initial value. The count S6 is output to the data comparison circuit 11 and the D/A converter 14.

The pulse period counter 12 resets the count S6 to the initial value when the enable signal S1 is in an enable state. After the enable signal S1 changes from the enable state to the disenable state and a preset number of clock signals S3 are input, counting of the clock signals S3 is started again.

The shift register 13 transfers and holds the serial data S2 transmitted from the controller 3 to an internal register in synchronization with the clock signals from the AND circuit 17 when the enable signal S1 is in an enable state. The serial data S2 transmitted from the controller 3 contains data for setting the pulse width and amplitude of the pulse current. The shift register 13 outputs these data as the pulse width data S7 and pulse amplitude data S8 to the data comparison circuit 11 and the D/A converter 14, respectively.

The timing of outputting the pulse width data S7 and the pulse amplitude data S8 is determined by the enable signal S1. The shift register 13 outputs the pulse width data S7 to the data comparison circuit 11 and the pulse amplitude data S8 to the D/A converter 14, respectively, after the enable signal S1 changes from the enable state to the disenable state and a preset number of clock signals S3 are input.

The D/A converter 14 inputs the signal S10, whose magnitude corresponds to the pulse amplitude data S8 from the shift register 13 and the clock count S6 from the pulse period counter 12, to the base of the npn transistor 15 via the resistor 16. That is, according to the clock count S6 and the value of the pulse amplitude data S8, the base current of the npn transistor 15 and the pulse current of the LED 2 are controlled, and this makes the luminance variable.

The output signal S10 of the D/A converter 14 is set to a value proportional to the product of the pulse amplitude data S8 and the clock count S6.

This can be realized for example by two D/A converters. First, in one D/A converter, the pulse amplitude data S8 is converted to an analogue voltage, which serves as a reference voltage of the other D/A converter. In the other D/A converter, the output signal S10 proportional to the clock count S6 is generated. The output signal S10 generated in this way is proportional to the pulse amplitude data S8 and the clock count S6.

Alternatively, the output signal S10 may be generated by using a multiplier. For example, the pulse amplitude data S8 is multiplied by the clock count S6 by the multiplier, and the multiplication result is converted into an analogue signal in a D/A converter, generating the output signal S10. The output signal S10 generated in this way is proportional to the pulse amplitude data S8 and the clock count S6.

The D/A converter 14 sets the output signal S10 in an ON state or OFF state according to the signal S9 output from the data comparison circuit 11. When the output signal S10 is set in an ON state, the output signal S10 proportional to the product of the pulse amplitude data S8 and the clock count S6 is supplied to the base of the npn transistor 15 via the resistor 16a to turn ON the npn transistor 15. When the output signal S10 is set in an OFF state, the output signal S10 is at low level, and no current flows through the base of the npn transistor 15, so the npn transistor 15 is turned OFF.

The npn transistor 15 supplies a pulse current to the LED 2 according to the output signal S10 of the D/A converter 14 received at the base via the resistor 16a. In FIG. 4, Vpd is used to represent a voltage supplied to an anode of a LED 2. The anodes of all LEDs 2 in FIG. 4 receive the same voltage Vpd.

When the output signal S10 is in an ON state, a current is supplied to the base via the resistor 16a, and the channel between the collector and the emitter of the npn transistor 15 is turned ON. Therefore, in a LED 2, a current flows from the power supply voltage Vpd through the collector, the emitter and the resistor 16b of the npn transistor 15 to the ground, whereby the LED 2 emits light at a luminance corresponding to this current.

When the output signal S10 is in an OFF state, no current flows to the base, so the channel between the collector and the emitter of the npn transistor 15 is turned OFF. Due to this, no current flows through a LED 2, and the LED 2 stops emitting light.

The AND circuit 17 receives the enable signal S1 and the clock signal S3. When the enable signal S1 is in an enable state, the clock signal S3 is output to the shift register 13.

The counter 18 is a circuit for generating the enable signal supplied to the pulse width modulation circuits 1 in cascade connection. After detecting a change of the enable signal S1 from an enable state to a disenable state and a preset number of clock signals S3 being input, an enable signal S4 of a preset clock length is output.

The delay circuit 19 gives a delay of a certain number of clocks to the input serial data S2 and outputs the data. This delay is for synchronizing the enable signal S4 output from the counter 18 with the serial data S5.

In the following, a description is given of the serial data and the enable signal input and output through a cascade connection in a pulse modulation circuit 1 having the configuration described above.

FIGS. 7A to 7E are time charts of a serial data and an enable signal input and output in a pulse modulation circuit 1.

FIG. 7A shows the serial data signal S2 input to the pulse width modulation circuit 1, FIG. 7B shows the clock signal S3, FIG. 7C shows the enable signal S1 input to the pulse width modulation circuit 1, FIG. 7D shows the serial data S5 output from the pulse width modulation circuit 1, and FIG. 7E shows the enable signal S4 output from the pulse width modulation circuit 1.

As already described, in FIG. 4, the signals output to the pulse width modulation circuits 1 from the terminal SO of the controller 3 are equivalent to the enable signal S1 and serial signal S2 in FIG. 6. The serial data S2 is comprised of data for setting the pulse amplitude and data for setting the pulse width. In the example of FIG. 7, the bit length of the data for setting the pulse amplitude is set to 4 bits, and the data are indicated by ID1 to ID4, respectively. The bit length of the data for setting the pulse width is set to 10 bits, and the data are indicated by PD1 to PD10, respectively. Therefore, in the example of FIG. 7, the word length of the serial data output from the controller 3 to the pulse width modulation circuit 1 is 14 bits.

Note that the bit numbers of the data for setting the pulse amplitude and pulse width of a current pulse, as well the word length of the serial data are not limited to the example in FIG. 7; they can be freely set according to the length of the data held in the shift register 13.

If the enable signal S1 is set to an enable state from a disenable state by the pulse setting data generator 32 and the serial data S2 is input to the pulse width modulation circuit 1 in synchronization with the clock signal S1, the serial data S2 is synchronized with the clock signal from the AND circuit 17 and is input to the shift register 13.

When the enable signal S1 is in an enable state, the count S6 of the pulse period counter 12 is reset to a certain initial value, the signal S9 of the data comparison circuit 11 is set in an OFF state and the LED 2 stops emitting light.

When serial data worth of one word is stored in the internal register of the shift register 13 (in the example of FIG. 4, it is the time when the bit PD10 of the serial data SDI is output), if the enable signal S1 is set to an disenable state from an enable state by the pulse setting data generator 32 or the pulse width modulation circuit 1 before, in synchronization with this operation, the enable output signal S4 is set to an enable state from a disenable state.

The period in which the output signal S4 stays in an enable state is set at the counter 18 to a certain number of clocks corresponding to the length of one word. In the example of FIG. 7, the output signal S4 keeps staying in an enable state for a period of 14 clocks.

The output serial data signal S5 is generated by delaying the input serial data signal S2 in the delay circuit 19 by a certain number of clocks (two clocks in the example of FIG. 7). The size of the delay is set so that the time when the enable signal S4 generated by the counter 18 changes to an enable state coincides with the time when the leading data of the 14-bit serial data (ID1 in FIG. 7) arrives at the terminal SDO.

The enable signal S4 and the serial data S5 of lengths set according to the word length are synchronized with each other and output from the terminals ENO and SDO, so the serial data passing through the pulse width modulation circuits 1 with their terminals SDI and SDO, and terminals ENI and ENO connected in cascade are set in the shift register 13 of each pulse width modulation circuit 1 in the order of the cascade connection. Namely, the serial data first output from the controller 3 are set in the pulse width modulation circuit 1 connected to the terminal SO of the controller 3, while the serial data last output are set in the pulse width modulation circuit 1 at the end of the cascade connection, i.e., that connected to the terminal SI of the controller 3.

As described above, the 14 bits of serial data including the pulse amplitude data (ID1 to ID4 in FIG. 7) and the pulse width data (PD1 to PD10 in FIG. 7) are output from the controller 3 to the pulse width modulation circuits 1 and are held in registers 13 of the pulse width modulation circuits 1. A pulse current having an amplitude and a pulse width corresponding to the data held in the shift register 13 of each pulse width modulation circuit 1 is supplied to each LED 2.

The pulse width modulation circuit 1 shown in FIG. 6 is a circuit used when the luminance data output from the controller 3 to the pulse width modulation circuit 1 are serial data, but as described previously, in the present invention, the data transmitted from the controller 3 to the pulse width modulation circuits 1 are not limited to serial data. They may also be parallel data. For example, an address bus and a data bus may be provided and a general method of parallel data transmission may be used to set luminance data to a pulse width modulation circuit 1 at a designated address.

Next, a description is given of the operation of driving the current in a LED 2 according to the serial data set in the register 13.

When the enable signal S1 changes from an enable state to a disenable state and a preset number of the clock signals S3 are input, the pulse width data S7 and pulse amplitude data S8 input to the shift register 13 are output to the data comparison circuit 11 and the D/A converter 14.

At this time, the pulse period counter 12 starts to count the clock signals S3 from a preset initial value. Further, the signal S9 of the data comparison circuit 11 is set to an ON state from an OFF state, and a current proportional to the product of the pulse count S6 and the pulse amplitude data S8 is supplied to the LED 2.

When the pulse width data S7 is output to the data comparison circuit 11 from the shift register 13, the clock count S6 and the input pulse width data S7 are compared. According to this comparison result, the signal S9 of the data comparison circuit 11 is set in an ON state or OFF state.

Here, a description is given of the case in which the signal S9 is set ON state when the pulse width data S7 is greater than the count S6, and it is set OFF state. when the pulse width data S7 is less than the count S6. In this case, if the pulse width data S7 is greater than the initial value of the count S6, at the time when the pulse period counter 12 starts counting, the LED 2 is driven to emit light.

The luminance of the LED 2 is proportional to the product of the pulse count S6 input to the D/A converter 14 and the pulse amplitude data S8. For example, if the clock count S6 is incremented when counting the clock signals, the current supplied to the LED 2 increases from a minimum value in proportion to the time. The increasing rate relative to the time is set according to the pulse amplitude data S8.

Next, a description is given of the case in which the clock count S6 is increased by increments when counting the clock signal.

If the clock count S6 is increased in the clock counting and exceeds the value of the pulse width data S7, the output signal S9 of the data comparison circuit 11 is set to an OFF state from an ON state, so the current in the LED 2 disappears, and the LED 2 stops emitting light.

The pulse period counter 12 continues counting the clock signals even after the LED 2 stopped light emitting, and when the count S6 reaches a preset value, the clock count S6 is reset to the initial value again. Then, from the initial value, counting is started again. In this way, the operation of resetting the clock value S6 at a certain value is repeated.

Repeating the clock counting by the pulse period counter 12 in this way, a pulse current having a duty ratio in accordance with the pulse width data S7 is supplied to the LED 2. The level of the pulse current increases with the time according to the clock count S6.

The period of the pulse current flowing through the LED 2 is determined by the period of the clock and the number of the clock counting by the pulse period counter 12. For example, if the period of the clock is 1:s, and the clock count S6 changes from 0 to 255, the period of the pulse current is 256:s.

FIGS. 8A to 8D are views of waveforms of pulse currents flowing through the LED 2 in the first embodiment.

Figure 8A:
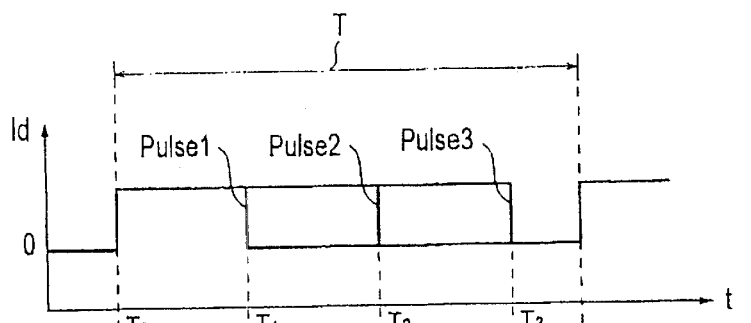
FIGS. 8A to 8D are views of waveforms of a pulse current flowing through a LED in the first embodiment.
Figure 8B:
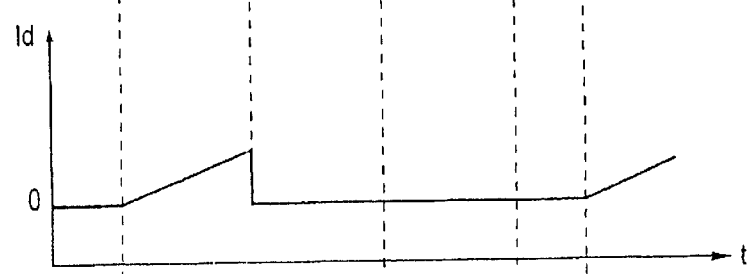
Figure 8C:
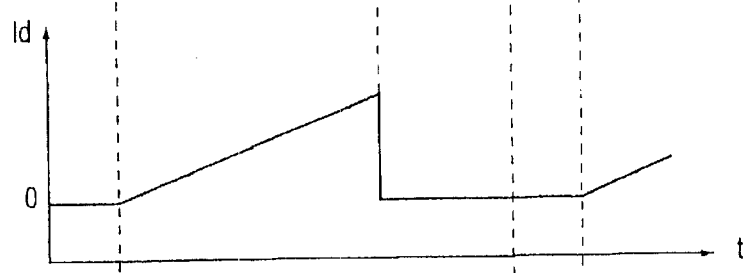
Figure 8D:
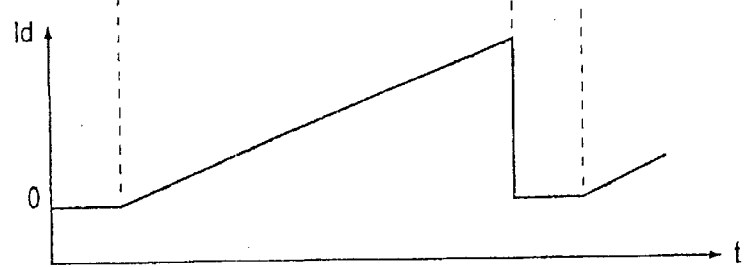

In FIGS. 8A to 8D, the ordinate and the abscissa indicate the current value and the time. FIG. 8A shows a waveform of a pulse current by a pulse width modulation circuit of the related art in which the pulse amplitude does not change. FIGS. 8B to 8D show waveforms of pulse currents flowing through the LED 2 supplied by the pulse width modulation circuit 1 in FIG. 6.

In FIGS. 8A to 8D, Pulse1, Pulse2 and Pulse3 represent waveforms of different pulse widths. Waveform Pulse1 has a pulse width equal to that of the waveform in FIG. 8B. Waveform Pulse2 has a pulse width equal to that of the waveform in FIG. 8C. Waveform Pulse3 has a pulse width equal to that of the waveform in FIG. 8D.

Further, in FIGS. 8A to 8D, T indicates the period of the pulses and T0 to T3 indicate time.

At time T0, if the pulse period counter 12 is reset and the pulse count S6 is initialized, a current is supplied to the LED 2, and LED 2 starts emitting light. At this time, in a pulse width modulation circuit of the related art, a constant current is supplied to the LED 2, as shown in FIG. 8A. On the other hand, due to the pulse width modulation circuit 1 of the present embodiment, in FIGS. 8B to 8D, the level of the pulse currents in the LED 2 proportionally increase with the time.

At time T1 to T3, if the count S6 of the pulse period counter 12 becomes equal to the pulse width data S7, the signal S9 of the data comparison circuit 11 is set in an OFF state, and as a result the current in the LED2 disappears.

As described previously, the LED luminance perceivable by the human senses is proportional to the current flowing through the LED averaged over time. Therefore, it is not required to set the amplitude of a pulse current constant, as in the pulse width modulation of the related art shown in FIG. 8A. In the present invention, both the pulse width and the pulse amplitude of the pulse current can be made variable. Even in this case, the luminance of an LED is equal to the current averaged over time.

While the time-averaged pulse current for the waveform in FIG. 8A is proportional to the pulse width, the time-averaged pulse currents of those in FIGS. 8B to 8D are proportional to the integration of the pulse currents in one period and, thus, are proportional to the square of their pulse widths. In addition, the pulse width is proportional to the luminance data of each pixel. So, in the present embodiment, the luminance of a LED is proportional to the square of the luminance data.

As described above, due to the γ-characteristic, the luminance of a CRT is generally proportional to the 2.2th power of the luminance data, so according to the present embodiment, the relation of the luminance and the luminance data is able to be made to approximately match the γ-characteristic of a CRT.

The above description is made taking as an example the case in which the clock count S6 output by the pulse period counter 12 increases when counting the clock, but even if the clock count S6 decreases during the clock counting, it is possible to supply to the LED 2 a current of a pulse width corresponding to the pulse width data S7.

In this case, counting is started from a certain initial value, e.g., 255, and in the pulse period counter 12, the clock count S6 is decreased by a decrement as the clock signal is input. When counting is started in the pulse period counter 12, since the clock count S6 is greater than the pulse width data, the output signal S9 of the data comparison circuit 11 is set to an OFF state, and the LED 2 does not emit light. The clock count S6 decreases with the time, and when it is less than the pulse width data S7, the output signal S9 of the data comparison circuit 11 is set to an ON state, and the LED 2 starts emitting light. After that, the clock count S6 is reset when the count S6 is reduced to a specified minimum value of the pulse period counter 12, e.g., 0, and the decrement starts again from the specified initial value. When the decrement starts in the pulse period counter 12 again, the output signal S9 of the data comparison circuit 11 is set to an OFF state, and when the clock count S6 becomes less than the pulse width data S7, the output signal S9 of the data comparison circuit 11 is set to an ON state again. The operations are repeated, as a result, a pulse current of a pulse width corresponding to the value of the pulse width data S7 flows in the LED 2.

By adjusting the pulse amplitude data S8, the maximum value of the signal S10 output from the D/A converter 14, i.e., the maximum value of the luminance, can be adjusted. Therefore, for example, it is possible to set the pulse amplitude data S8 into each pulse width modulation circuit 1 to correct the performance fluctuations of LEDs due to the differences of individual LEDs.

Further, it is also possible to perform pre-processing to correct the fluctuations of individual LEDs in the pulse width data to be set in each pulse width modulation circuit 1 and to set the processed pulse width data in each pulse width modulation circuit 1. In this case, it is not necessary to set the pulse amplitude data S8 into each pulse width modulation circuit 1 by the controller 3, so the control data of the D/A converter 14 in FIG. 6 includes only the signal S9 from the data comparison circuit 11 and the clock count S6.

Second Embodiment

In the following, the second embodiment of the present invention will be described.

In the first embodiment, the level of the pulse current corresponding to the clock count S6 is made variable. In the second embodiment, one period of a pulse current is divided into several sub-frame periods, and the amplitude of the pulse current is decided in each sub-frame period. As a result, compared with the first embodiment, although the steps of the amplitude variation. becomes rough, the pulse width modulation circuit 1 is simplified.

Figure 9:
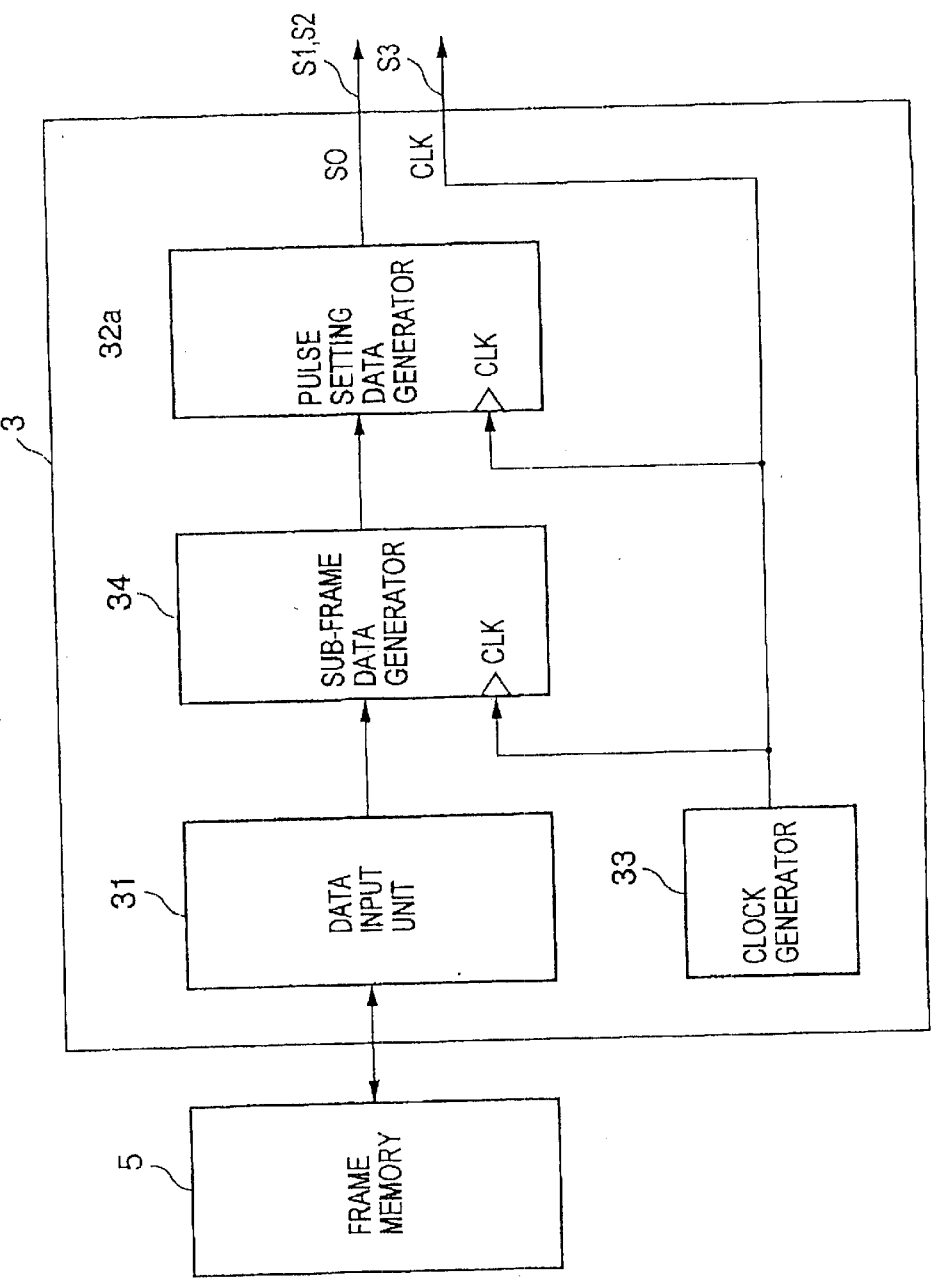
FIG. 9 is a block diagram for explaining the operation of a controller in a second embodiment.

FIG. 9 is a block diagram for explaining the operation of the controller 3 in the second embodiment.

In FIG. 9, reference numerals 34 and 32a represent a sub-frame data generator and a pulse setting data generator, respectively. The same reference numerals are used for the same elements in FIG. 9 and FIG. 5.

From the luminance data received from the data input unit 31, the sub-frame data generator 34 generates pulse width data and pulse amplitude data in each sub-frame period mentioned above and outputs these data to the pulse setting data generator 32a at the beginning of each sub-frame period. The timing of outputting these data to the pulse setting data generator 32a is determined by the clock signals from the clock generator 33.

The pulse setting data generator 32a outputs the pulse width data and pulse amplitude data output from the sub-frame data generator 34 to the pulse width modulation circuits 1 at the beginning of each sub-frame period. The difference from the pulse setting data generator 32 in the first embodiment is that here the pulse width data and pulse amplitude data are output to the pulse width modulation circuits 1 at the time when these data are input. The operations of conversion to serial data and generation of an enable signal are the same as what the pulse setting data generator 32 did in the first embodiment.

The pulse width data and pulse amplitude data in each sub-frame period are, for example, generated in the following way.

First, the clock signals from the clock generator 33 are counted by a counter equivalent to the pulse period counter 12, and a periodically changing count is generated. The period of the changing count is equal to that of the pulse current, so the count can be considered as a phase value corresponding to the phase in one period of the pulse current.

The initial phase of each sub-frame is set to the phase value. For example, in the first sub-frame period of one period of the pulse current, the initial phase value of the first sub-frame period is the same as that of the period. The amplitude of the pulse current changes at initial phases of the sub-frames.

The generated phase value changes with the time. When it becomes equal to a sub-frame initial phase value, the sub-frame initial phase value is compared with the value of a input luminance data. If the sub-frame initial phase value is less than the value of the input luminance data, i.e., the sub-frame initial phase value is earlier than the value of the input luminance data, the difference between the value of the input luminance data and the sub-frame initial phase value is found, and the obtained difference is output to the pulse setting data generator 32a as pulse width data. If the sub-frame initial phase value is greater than the value of the input luminance data, no pulse width data are generated.

For example, assume the phase value changes from 0 to 255, there are three sub-frame initial phase values as 0, 100 and 200, and the input luminance data is 150. First, the initial phase value zero of a sub-frame, which is at the beginning of a period having an initial phase of zero, is compared with the input luminance data 150. Since the sub-frame initial phase value is less than the input luminance data, a pulse width data 150, which is the difference between the input luminance data 150 and the sub-frame initial phase value 0, is output to the pulse setting data generator 32a. Similarly, when the phase value becomes 100, the sub-frame initial phase value 100 is compared with the input luminance data 150. Since the sub-frame initial phase value is less than the input luminance data, a pulse width data 50, which is the difference between the input luminance data 150 and the sub-frame initial phase value 100, is output to the pulse setting data generator 32a. In addition, when the phase becomes 200, the sub-frame initial phase value 200 is compared with the input luminance data 150. Since the sub-frame initial phase value is greater than the input luminance data, no pulse width data is generated.

That is, for a luminance data 150, pulse width data 150 and 50 are generated and output to the pulse setting data generator 32a when the phase value becomes equal to the sub-frame initial phase values 0 and 100.

Note that if the pulse width data 150 is input to the pulse width modulation circuit 1, the pulse width of the pulse current is set to 150 relative to the phase value, and this value ends up exceeding the sub-frame initial phase value 100. In this case, when the next pulse width data 50 is input to the pulse width modulation circuit 1, the pulse width data 150 held in the shift register 13 is updated by 50, so a pulse width data exceeding the sub-frame period will not be set.

The pulse amplitude data are decided in each sub-frame period and are output to the pulse setting data generator 32a together with pulse width data.

The pulse width data and the pulse amplitude data generated in this way are converted into serial data and output to each pulse width modulation circuit 1 when they are input to the pulse setting data generator 32a.

Below, the pulse width modulation circuit 1 in the present embodiment will be explained.

Figure 10:
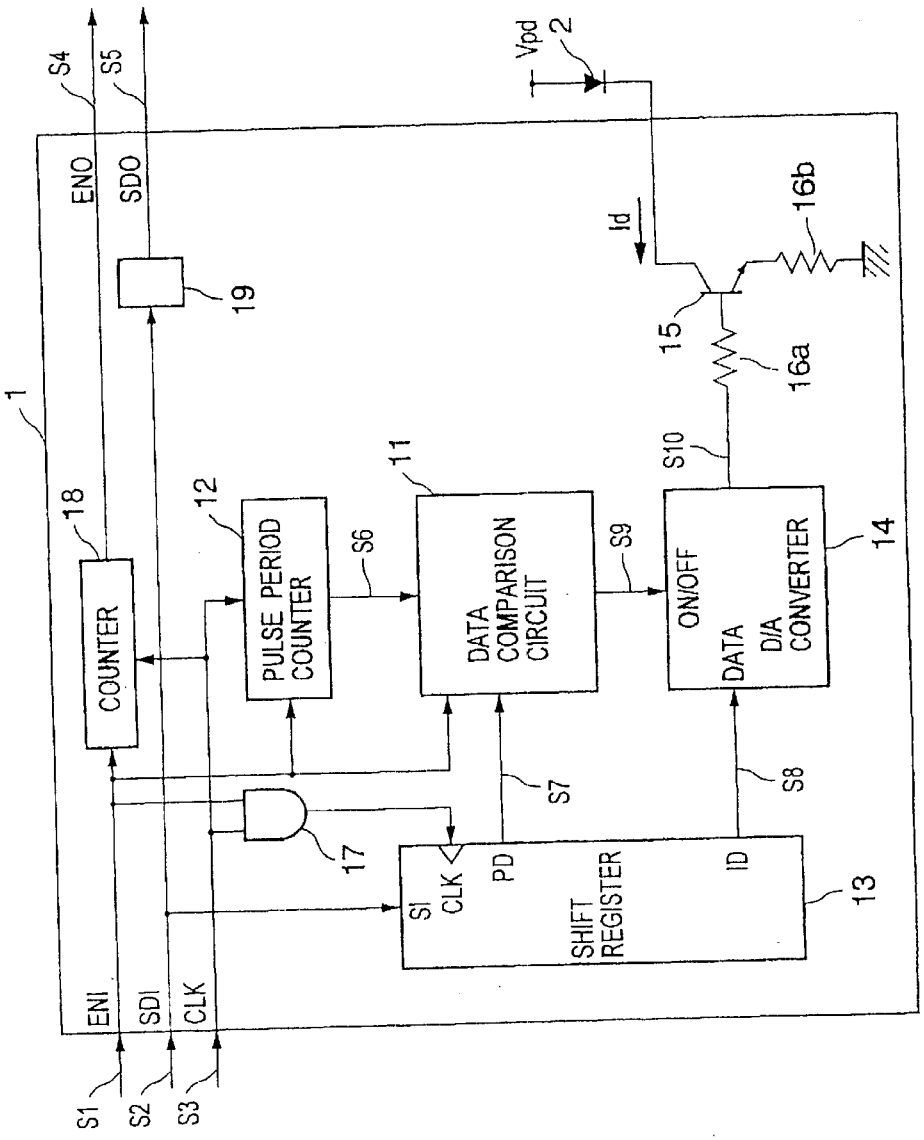
FIG. 10 is a block diagram of a pulse width modulation circuit in the second embodiment.

FIG. 10 is a block diagram of the pulse width modulation circuit 1 in the second embodiment.

In FIG. 10, 14a represents a D/A converter. In addition, the same reference numerals are used for the same elements in FIG. 6 and FIG. 10.

The pulse width modulation circuit 1 of the present embodiment, as shown in FIG. 10, is different from that of the first embodiment as shown in FIG. 6, in the point that the pulse count S6 is not input to the D/A converter. Specifically, while the output signal S10 of the D/A converter 14 in FIG. 6 is generated in proportion to the product of the pulse amplitude data S8 and the clock count S6, the output signal S10 of the D/A converter 14a in FIG. 10 is generated by simple D/A conversion of the pulse amplitude data S8. Therefore, it is not necessary to use two D/A converters or a multiplier, as in the D/A converter 14 in FIG. 6, so the circuit is simplified.

FIGS. 11A to 11D are views of waveforms of pulse currents flowing through the LED 2 in the second embodiment.

Figure 11:
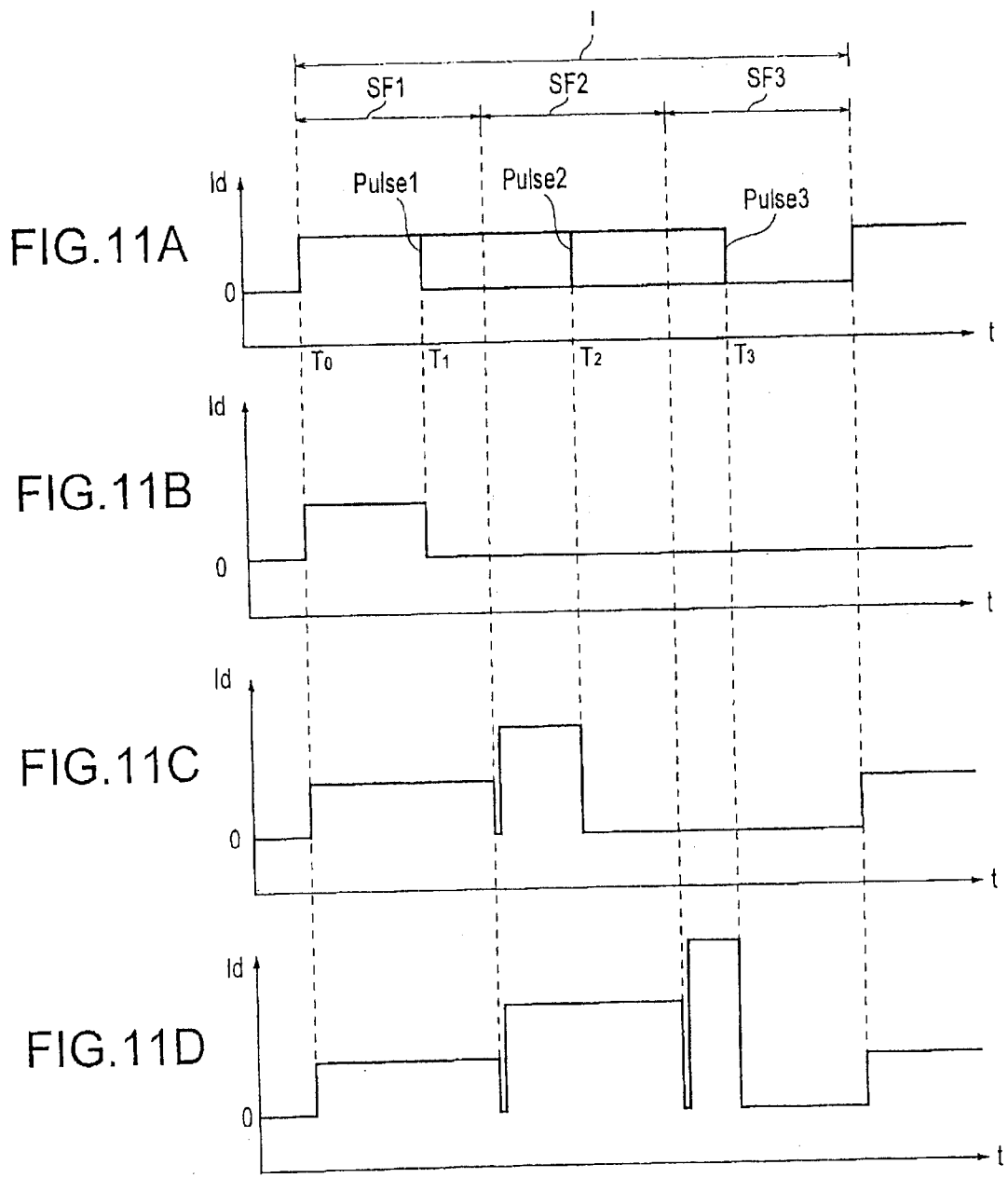
FIGS. 11A to 11D are views of waveforms of a pulse current flowing through a LED in the second embodiment.

In FIGS. 11A to 11D, the ordinate and the abscissa indicate the current value and the time. FIG. 11A shows a waveform of a pulse current supplied by a pulse width modulation circuit of the related art in which the pulse amplitude does not change, while FIGS. 8B to 8D show waveforms of pulse currents flowing through the LED 2 supplied by the pulse width modulation circuit 1 in FIG. 10.

In FIGS. 11A to 11D, SF1, SF2 and SF3 represent different sub-frame periods, and Pulse1, Pulse2 and Pulse3 represent waveforms of different pulse widths. The waveform Pulse1 has a pulse width equal to that of the waveform in FIG. 11B. The waveform Pulse2 has a pulse width equal to that of the waveform in FIG. 11C, and Pulse3 to FIG. 11D.

Further, in FIGS. 11A to 11D, T indicates the period of the pulses and T0 to T3 indicate time.

At time T0, if the pulse period counter 12 is reset and the pulse count S6 is initialized, a current is supplied to the LED 2, and the LED 2 starts emitting light. In a pulse width modulation circuit of the related art, as shown in FIG. 11A, a constant current is supplied to the LED 2. On the other hand, due to the pulse width modulation circuit 1 of the present embodiment, in FIGS. 11B to 11D, the amplitudes of pulse currents in the LED 2 in different sub-frame periods are different and increase with the time.

But in each sub-frame, the pulse current amplitude is constant, and this is different from the waveforms in FIGS. 8B to 8D. In detail, in FIG. 6, according to the change of the clock count S6 in the D/A converter 14, the output signal S10 changes with the time, and along with this change, the amplitude of the pulse current also changes. In the D/A converter 14a of FIG. 10, a constant output signal S10 is generated according to the pulse amplitude data S8 input in each sub-frame period, so the pulse current amplitude in each sub-frame period is constant.

At time T1 to T3, if the count S6 of the pulse period counter 12 becomes equal to the pulse width data S7, the signal S9 of the data comparison circuit 11 is set to an OFF state, so the current in the LED2 disappears.

At the beginning of each sub-frame period, the pulse current is zero for a very short time period. This corresponds to the period in which data is transferred to the register 13. In this period, because the enable signal S1 is in an enable state, the output signal S10 of the D/A converter 14a is set to an OFF state, and there is no current in the LED 2.

The time-averaged pulse currents of the waveforms in FIGS. 8B to 8D are proportional to the square of the luminance data. In the waveforms in FIGS. 11B to 11D, by suitably setting the number of the sub-frame periods and the pulse amplitude data that appropriately changes the amplitude of the pulse current in each sub-frame period according to the change of phase values, the relation of the time-averaged pulse current and the luminance data is able to be made to approach a specified characteristic.

Figure 12:
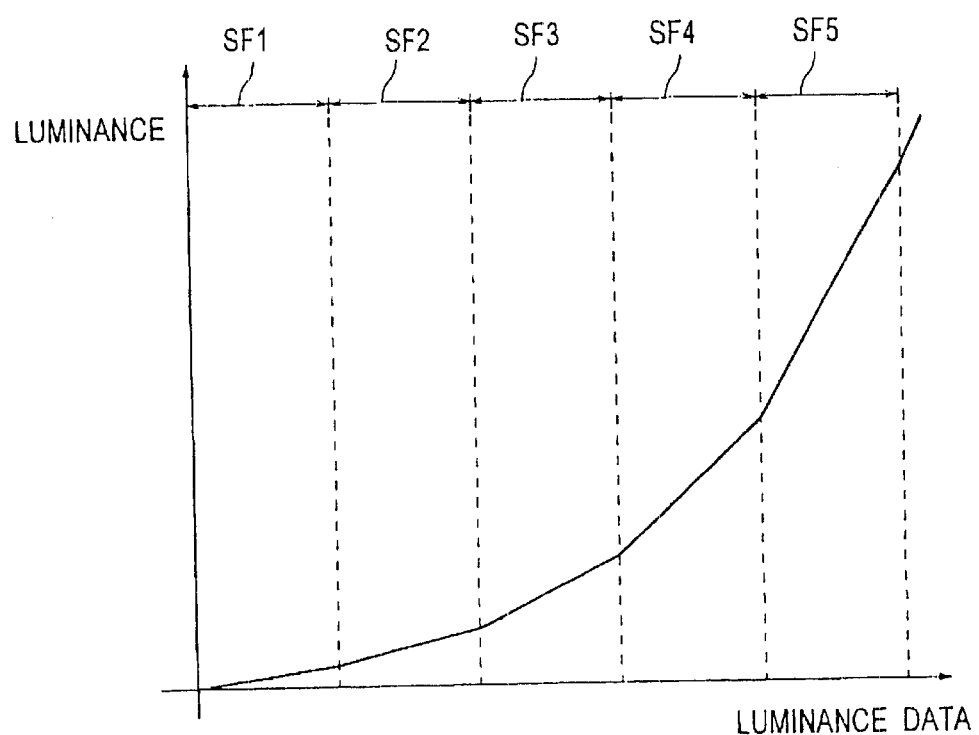
FIG. 12 is a view of the relation of the light-emitting luminance with the luminance data in the second embodiment.

FIG. 12 is a view of the relation of the luminance with the luminance data in the second embodiment.

In FIG. 12, the ordinate and the abscissa indicate the light emitting luminance and the luminance data, respectively, and SF1 to SF5 represent different sub-frame periods.

As shown in FIG. 12, pulse amplitude data are set corresponding to the sub-frame periods SF1 to SF5. Because the amplitude of the pulse current is different in different sub-frame periods, the relation between the light emitting luminance and the luminance data is expressed by a line graph. The sub-frame periods and the pulse amplitude data are set so that this line graph is similar to the γ-characteristic of a CRT.

By further adjusting the pulse amplitude data S8 set in each sub-frame for each pixel, it is possible to correct the fluctuations of performance due to the differences of individual LEDs.

Further, it is also possible to perform pre-processing to correct the fluctuations of individual LEDs in the pulse width data to be set in each pulse width modulation circuit 1 and set the processed pulse width data in each pulse width modulation circuit 1. In this case, a fine resolution is not necessary for correcting the fluctuations of individual LEDs in the D/A converter 14a, so it is possible to replace the D/A converter 14a with current sources corresponding to sub-frame periods and to switch these current sources according to the pulse width data S8 to drive the LED 2. As a result, the circuit of the pulse width modulation circuit 1 can be simplified.

As described above, according to the LED display related to the first embodiment of the present invention, a clock count S6 corresponding to the phase in one period of the pulse current is generated by the pulse period counter 12 and is compared with a pulse width data S7 in the data comparison circuit 11. At the initial phase in one period of the pulse current, or at the phase where the clock count S6 equals the pulse width data S7, the output signal S9 of the data comparison circuit 11 is set. in an ON state or OFF state, and the output signal S10 of the D/A converter 14 is set in an ON state or OFF state, whereby the pulse current flows through the LED 2. In addition, when the output signal S9 of the data comparison circuit 11 is in an ON state, the output signal S10 of the D/A converter 14 changes in proportion to the clock count S6, so the relation of the luminance data and the light-emitting luminance of an LED can be made to match the γ-characteristic of a CRT without increasing the bit length of the luminance data or performing pre-processing for correcting the luminance data. Further, since the scale of the circuit can be made small, the power consumption is able to be lowered, and the apparatus can be fabricated at a low cost in small size.

According to the second embodiment of the present invention, the initial phase of each sub-frame period is compared with the phase designated by the luminance data in the sub-frame data generator 34. Pulse width data corresponding to the phase difference between the phase designated by the luminance data and the initial phase of a sub-frame period earlier than the phase designated by the luminance data, and a pulse amplitude data set corresponding to the sub-frame period are output to each pulse width modulation circuit 1 from the controller 3 at the initial phase of the sub-frame period. According to the input pulse width data and the pulse amplitude data, counting of the clock pulses is started from a specified initial value in the pulse period counter 12. The clock count S6 and the pulse width data S7 are compared in the data comparison circuit 11, and when the clock count S6 is equal to a certain initial value and the pulse width data S7, the output signal S9 of the data comparison circuit 11 is set in an ON state or OFF state, and the output signal S10 of the D/A converter 14 is set in an ON state or OFF state, whereby a pulse current is supplied to the LED 2. In addition, according to the pulse amplitude data S8, the amplitude of the pulse current changes in different sub-frame periods. Due to this, the relation of the luminance data and the light-emitting luminance of an LED can be made to match the γ-characteristic of a CRT without increasing the bit length of the luminance data or performing pre-processing for correcting the luminance data. Further, since the scale of the circuit can be made small, the power consumption is able to be lowered, and the apparatus can be fabricated at a low cost in small size.

Summarizing the effects of the present invention, according to the present invention, in a modulation circuit for outputting pulse signals modulated in accordance with values of input data at a predetermined period, the input data and the pulse width of the pulse signals can be set to match a specified characteristic without increasing the bit length of the input data or performing pre-processing for correcting the input data. For example, in an image display comprised of LEDs using such modulation circuits, corrections to match the γ-characteristic of a CRT is enabled. Consequently, the scale of the circuit can be made small.

What is claimed is:

1. A modulation circuit for modulating an input data on a pulse width and a pulse amplitude in response to the value of the input data and generating a pulse signal at a predetermined period, comprising
   a phase data generating circuit for generating a phase data whose value is varied in response to a phase in the period;
   a data comparison circuit for setting a control signal at a first level at the beginning of every period, comparing the phase data and the input data, and setting the control signal at a second level when the phase data and the input data coincide; and
   a pulse signal generating circuit for setting the level of the pulse signal at a reference level at the beginning of every period, changing the level of the pulse signal in response to the phase data when the control signal is at the first level, setting the level of the pulse signal at the reference level when the control signal is changed to the second level, and outputting the resultant pulse signal.

2. A modulation circuit as set forth in claim 1, wherein when the control signal is at the first level, said pulse signal outputting circuit changes the level of the pulse signal in proportion to the product of an input pulse amplitude data and the phase data.

3. A modulation circuit as set forth in claim 1, wherein said pulse signal outputting circuit comprises
   a first conversion circuit for converting an input pulse amplitude data into an analog signal having a level corresponding to the value of the input data; and
   a second conversion circuit for converting the phase data into the pulse signal having a level corresponding to the value of the phase data with the analog signal as a reference.

4. A modulation circuit as set forth in claim 1, wherein said pulse signal outputting circuit comprises
   a multiplier for multiplying the value of the input pulse amplitude data with that of the phase data; and
   a conversion circuit for converting the multiplication result from the multiplier into the pulse signal having a level corresponding to the value of the result.

5. A modulation circuit as set forth in claim 1, wherein said phase data generating circuit counts input clock pulses, initializes the count to a preset initial value and counts the clock pulses again when the count reaches a preset value, and outputs the count as the phase data.

6. A modulation circuit for modulating an input data on a pulse width and a pulse amplitude in response to the value of the input data and generating a pulse signal at a predetermined period, comprising
  a data outputting circuit which compares the input data with a plurality of preset initial phase data at phases of the period corresponding to the initial phase data, and as a result of the comparison, outputs a pulse width data corresponding to a difference between a value of one of the initial phase data and that of the input data and a specified pulse amplitude data corresponding to the initial phase data when the phase corresponding to one of the initial phase data is earlier than the phase corresponding to the input data;
  a phase data generating circuit for generating a phase data whose value is varied in response to a phase in the period;
  a data comparison circuit for setting a control signal at a first level at the beginning of every period, comparing the phase data and the pulse width data, and setting the control signal at a second level when the phase data and the pulse width data coincide; and
  a pulse signal generating circuit for setting the level of the pulse signal at a reference level at the beginning of every period, changing the level of the pulse signal in response to the pulse amplitude data when the control signal is at the first level, setting the level of the pulse signal at the reference level when the level of the control signal is changed to the second level, and outputting the resultant pulse signal.

7. A modulation circuit as set forth in claim 6, wherein said data outputting circuit counts input clock pulses, initializes the count to a preset initial value and counts the clock pulses again when the count reaches a preset value, and compares one of the initial phase data with the value of the input data at a phase where the count coincides with the initial phase data.

8. A modulation circuit as set forth in claim 6, wherein said phase data generating circuit counts input clock pulses, initializes the count to a preset initial value and counts the clock pulses again when the count reaches a preset value, and outputs the count as the phase data.

9. An image display comprising
  a plurality of modulation circuits each modulating an input data on a pulse width and a pulse amplitude in response to the value of the input data and generating a pulse signal at a predetermined period; and
  a plurality of light emitting elements arranged bi-dimensionally to form an image displaying member and each emitting light of a luminance corresponding to levels of the pulse signals,
  wherein each modulation circuit comprises
    a phase data generating circuit for generating a phase data whose value is varied in response to a phase in the period;
    a data comparison circuit for setting a control signal at a first level at the beginning of every period, comparing the phase data and the input data, and setting the control signal at a second level when the phase data and the input data coincide; and
    a pulse signal generating circuit for setting the level of the pulse signal at a reference level at the beginning of every period, changing the level of the pulse signal in response to the phase data when the the control signal is at the first level, setting the level of the pulse signal at the reference level when the level of the control signal is changed to the second level, and outputting the resultant pulse signal.

10. An image display as set forth in claim 9, wherein each said modulation circuit comprises
  a first input terminal into which the input data is input;
  a first output terminal from which the input data is output;
  a second input terminal into which an enable signal is input;
  a second output terminal from which the enable signal is output;
  an enable signal generating circuit for outputting the enable signal from the second output terminal, when the enable signal input from the second input terminal changes from the enable state to the disenable state, said enable signal being set to an enable state for a predetermined period and then to a disenable state; and
  a data holding circuit for holding the input data input from the first input terminal when the enable signal is in the enable state, and outputting the held input data when the enable signal changes from the enable state to the disenable state, and
  the first output terminal and the second output terminal of each modulation circuit are connected in cascade with the first input terminal and the second input terminal of a modulation circuit at the next stage, respectively, and
  said phase data generating circuit sets the value of the phase data to a preset initial data when the enable signal is in the enable state, and periodically changes the value of the phase data at said period when the enable signal is in the disenable state, and
  said data comparison circuit sets the control signal to the second level when the enable signal is in the enable state, and compares an input data output from the data holding circuit with the phase data when the enable signal is in the disenable state.

11. An image display as set forth in claim 9, wherein when the control signal is at the first level, said pulse signal outputting circuit changes the level of the pulse signal in proportion to the product of an input pulse amplitude data and the phase data.

12. An image display as set forth in claim 9, wherein said pulse signal outputting circuit comprises
  a first conversion circuit for converting an input pulse amplitude data into an analog signal having a level corresponding to the value of the input data; and
  a second conversion circuit for converting the phase data into the pulse signal having a level corresponding to the value of the phase data with the analog signal as a reference.

13. An image display as set forth in claim 9, wherein said pulse signal outputting circuit comprises
  a multiplier for multiplying the value of the input pulse amplitude data with that of the phase data; and
  a conversion circuit for converting the multiplication result from the multiplier into the pulse signal having a level corresponding to the value of the result.

14. An image display as set forth in claim 9, wherein said phase data generating circuit counts input clock pulses, initializes the count to a preset initial value and counts the clock pulses again when the count reaches a preset value, and outputs the count as the phase data.

15. An image display comprising
a plurality of modulation circuits each modulating an input data on a pulse width and a pulse amplitude in response to the value of the input data and generating a pulse signal at a predetermined period; and
a plurality of light emitting elements arranged bi-dimensionally to form an image displaying member and each emitting light of a luminance corresponding to levels of the pulse signals,
wherein each modulation circuit comprises
a data outputting circuit which compares the input data with a plurality of preset initial phase data at phases of the period corresponding to the initial phase data, and as a result of the comparison, outputs a pulse width data corresponding to a difference between a value of one of the initial phase data and that of the input data and a specified pulse amplitude data corresponding to the initial phase data when the phase corresponding to one of the initial phase data is earlier than the phase corresponding to the input data;
a phase data generating circuit for generating a phase data whose value is varied in response to a phase in the period;
a data comparison circuit for setting a control signal at a first level at the beginning of every period, comparing the phase data and the pulse width data, and setting the control signal at a second level when the phase data and the pulse width data coincide; and
a pulse signal generating circuit for setting the level of the pulse signal at a reference level at the beginning of every period, changing the level of the pulse signal in response to the pulse amplitude data when the control signal is at the first level, setting the level of the pulse signal at the reference level when the level of the control signal is changed to the second level, and outputting the resultant pulse signal.

16. An image display as set forth in claim 15, wherein each said modulation circuit comprises
a first input terminal into which the pulse width data and the pulse amplitude data are input;
a first output terminal from which the pulse width data and the pulse amplitude data are output;
a second input terminal into which an enable signal is input;
a second output terminal from which the enable signal is output;
an enable signal generating circuit for outputting the enable signal from the second output terminal, when the enable signal input from the second input terminal changes from the enable state to the disenable state, said enable signal being set to an enable state for a predetermined period and then to a disenable state; and
a data holding circuit for holding the pulse width data and the pulse amplitude data input from the first input terminal when the enable signal is in the enable state, and outputting the held pulse width data and pulse amplitude data when the enable signal changes from the enable state to the disenable state, and
the first output terminal and the second output terminal of each modulation circuit are connected in cascade with the first input terminal and the second input terminal of a modulation circuit at the next stage, respectively, and
said phase data generating circuit sets the value of the phase data to a preset initial data when the enable signal is in the enable state, and periodically changes the value of the phase data at said period when the enable signal is in the disenable state, and
said data comparison circuit sets the control signal to the second level when the enable signal is in the enable state, and compares a pulse width data output from the data holding circuit with the phase data when the enable signal is in the disenable state.

17. An image display as set forth in claim 15, wherein said data outputting circuit counts input clock pulses, initializes the count to a preset initial value and counts the clock pulses again when the count reaches a preset value, and compares one of the initial phase data with the value of the input data at a phase where the count coincides with the initial phase data.

18. An image display as set forth in claim 15, wherein said phase data generating circuit counts input clock pulses, initializes the count to a preset initial value and counts the clock pulses again when the count reaches a preset value, and outputs the count as the phase data.

* * * * *

UNITED STATES PATENT AND TRADEMARK OFFICE
CERTIFICATE OF CORRECTION

PATENT NO.    : 6,472,946 B2
DATED         : October 29, 2002
INVENTOR(S)   : Yuichi Takagi It is certified that error appears in the above-identified patent and that said Letters Patent is hereby corrected as shown below:

Column 22,
Line 2, remove the "the" (second occurrence).

Signed and Sealed this

Eleventh Day of March, 2003

JAMES E. ROGAN
*Director of the United States Patent and Trademark Office*